United States Patent [19]

Kwok

[11] 4,349,795
[45] Sep. 14, 1982

[54] RF TRAP FOR A CABLE TELEVISION TRUNK AMPLIFIER STATION

[75] Inventor: Sai W. Kwok, El Paso, Tex.

[73] Assignee: GTE Automatic Electric Laboratories, Inc., Northlake, Ill.

[21] Appl. No.: 193,311

[22] Filed: Oct. 1, 1980

[51] Int. Cl.³ .................... H03H 7/46; H03H 7/01; H04N 7/10
[52] U.S. Cl. .................... 333/176; 333/101; 333/181; 333/185; 358/86; 455/8
[58] Field of Search .................... 333/1-5, 333/105-107, 167, 174-176, 180-185, 24 R, 24 C, 258-259, 262-263, 101, 132; 455/3-8; 358/86

[56] References Cited

U.S. PATENT DOCUMENTS 3,086,091 4/1963 Reid .................... 358/86 X
3,566,020 2/1971 Kinross et al. .................... 358/86
4,167,714 9/1979 Flora .................... 333/101

*Primary Examiner*—Marvin L. Nussbaum
*Attorney, Agent, or Firm*—Russell A. Cannon

[57] ABSTRACT

In an amplifier station for a trunk system, switching apparatus responsive to the absence or presence of a control signal selectively passes R. F. signals in a prescribed frequency band on a main transmission line to first and second lines. During normal operation of the amplifier relay coils are energized so as to engage second and third contacts for passing signals on the second line with amplification. When the amplifier is operating properly, PIN diodes short opposite ends of the first line for improving isolation in the station equipment. In the event of amplifier malfunction, first and third contacts are engaged thereby providing transmission along the first line. A tubular conductive member surrounds the switch contacts so as to provide capacitive coupling thereto. The tubular member is capacitively coupled to a ground plane to thereby by-pass signals which are above the desired passband of the trunk system.

18 Claims, 3 Drawing Figures

RF TRAP FOR A CABLE TELEVISION TRUNK AMPLIFIER STATION

This invention relates to trunk amplifier stations for cable tv (television) systems, and more particularly to relay means in a trunk amplifier station that passes frequencies in a prescribed frequency band away from contacts thereof.

A cable tv system may have as many as thirty trunk amplifier stations periodically connected in series along a trunk cable. It is desirable to continue to pass tv signals in the trunk cable when a particular amplifier malfunctions or fails. In accordance with one aspect of this invention, this is accomplished by switching the tv signals to a bypass line in a trunk station when the active elements in the amplification path there fails. In some subscriber carrier telephone systems, a matrix of diode switches is employed to switch signals on a primary cable to a secondary cable, in order to assure a very low level of crosstalk between the cables when they are both simultaneously used for transmitting telephone communications. Since the isolation requirements are less stringent and the cost of system components of major importance in cable tv systems, however, less complex switching arrangements may be employed. Although a PIN (positive immittance negatively doped) diode switch could provide high isolation between amplification and bypass lines in a trunk station, such a switch requires external power to accomplish switching to each of these lines. Although relays with form-C type reed contacts have lower isolation between ports thereof then diode switches, such a relay is attractive since it does not require electrical power to make a connection to a bypass line when trunk station circuitry malfunctions.

In a trunk station embodying this invention, reed relays are employed at opposite ends of a bypass length of coaxial transmission line and another line having a 50-300 MHz passband amplifier therein. PIN diodes are connected across ends of the bypass line for short circuiting them when the amplifier operates satisfactorily. Although this provides increased isolation in the station, the out-of-band attenuation in the overall station response falls off somewhat in the area of 350 MHz. This degradation of the high frequency response is found to be compounded in cascaded trunk stations, such that tv signals on the trunk cable may be impaired as they are passed through a large number (e.g. 30) of trunk amplifier stations. Although sophisticated trap filters may be connected to opposite ends of the bypass line, this is expensive and requires space in the trunk station housing.

In accordance with another aspect of this invention, apparatus operative in conjunction with a ground plane so as to be responsive to the absence and presence of a control signal for selectively passing first RF signal frequencies in a first prescribed frequency band on a trunk line to first and second lines and for passing second RF signal frequencies (that are in a second prescribed frequency band that is above the first frequency band) away from the lines, comprises: first, second and third elongated contacts that are substantially parallel to each other and that have one ends thereof overlapping, the one ends of the first and third contacts making an electrical connection therebetween in the absence of a control signal for passing the first signals along the trunk and first lines without amplification, their other ends being electrically connected to the first, second and trunk lines, respectively; first means responsive to the presence of the control signal for causing the second and third contacts to make an electrical connection therebetween for passing the first signals along the trunk and second lines with amplification; a tubular conductive member electrically spaced from, extending over at least a major portion of the lengths of, and extending around the contacts, and operative in conjunction with the contacts and ground plane as coupled transmission lines having capacitive coupling between the tubular member and contacts; a capacitor having one side thereof connected to ground; and a first length of conductive wire electrically connecting the other side of the capacitor to the tubular member and characterized so as to provide an inductance at RF frequencies; the reactances of the capacitor, the sleeve, the contacts, the wire and the sections of coupled transmission lines cooperating so as to operate as a frequency trap bypassing second frequency signals on the lines to ground.

This invention will be more fully understood from the following descriptions of preferred embodiments thereof, together with the drawing in which.

Figure 1:
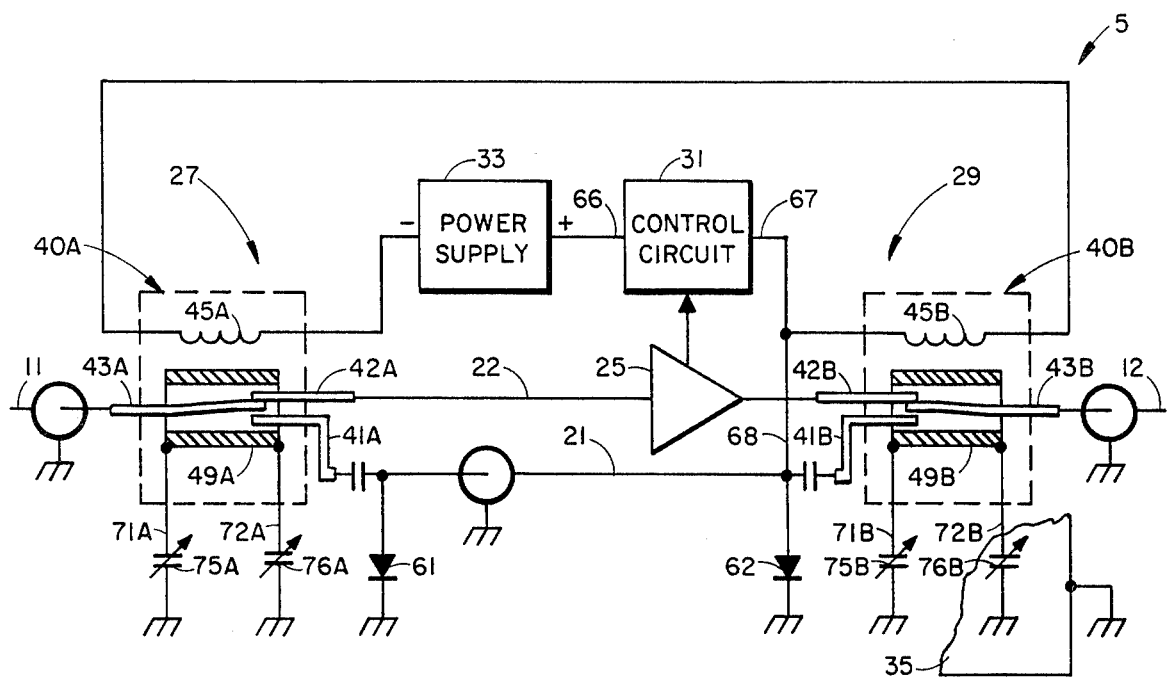
FIG. 1 is a schematic circuit diagram of trunk amplifier station equipment 5 embodying this invention.

Referring now to FIG. 1, a trunk amplifier station 5 in a television system is electrically connected in series with line sections 11 and 12 of a trunk cable or line that may be a coaxial transmission line carrying first RF television signals in a first frequency band from 50 MHz-300 MHz and having its outer conductor connected to ground. The trunk station 5 comprises a first bypass line 21, which is a length of coaxial transmission line having its outer conductor electrically connected to ground, a second transmission line 22 having amplification means 25 in series in it, frequency selective relay circuits 27 and 29 at opposite ends of the lines 21 and 22 for selectively connecting them to the lines 11 and 12 of the cable, and a circuit 31 for monitoring the operation of the amplifier and controlling the operation of the relay circuits, all of which is located in an enclosure 35 that is connected to ground and which operates as a ground plane for components of the trunk station.

The line 21 is a length of RG 59 coaxial transmission line, that is selected for its low dielectric constant which causes electromagnetic waves in it to have a high velocity of propagation. The other line 22 is also a coaxial cable. The amplifier means 25 in line 22 includes active elements having DC currents passed thereby and is operative to amplify RF signals in the 50-300 MHz passband that are transmitted on lines 11 and 12 in the forward direction that is from left to right in FIG. 1. The station may also include second amplifier means (not shown) providing amplification of RF signals (in another passband) that are transmitted on the trunk lines in the reverse direction, i.e., from right to left, in FIG. 1. Such a station would provide two way communication on the trunk cable.

Figure 2:
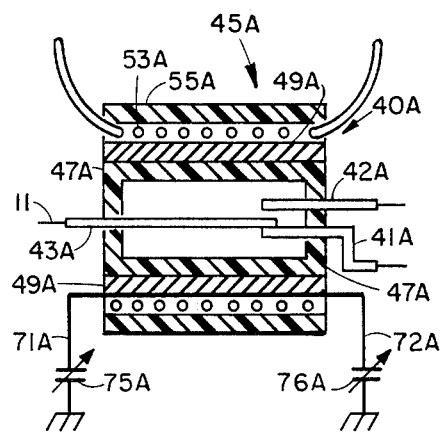
FIG. 2 is a greatly enlarged section view of a reed relay assembly 40A embodying this invention.

The frequency selective relay circuits 27 and 29 are identical, elements thereof being identified by the same reference numerals and the subscripts A and B, respectively. Only one of the relay circuits will therefore be described in detail. The circuit 27 comprises a relay of the break before make type having first, second and third form C type reed contacts 41A, 42A and 43A and an excitation coil 45A. The relays are shown in FIG. 1 in the energized state. The relay 27 is shown in FIG. 2 in the normal or de-energized state. The relay contacts 41A-43A may be circular or rectangular rods or reeds that are made of a material consisting of 52% nickle and 48% iron, for example, and which becomes magnetic when an electrical current is passed through the winding 45A. The free ends of the reeds are plated with a coating of rhodium to increase their surface hardness and stability. The contacts 41A-43A are mounted so as to be substantially parallel to each other in a cylindrical dielectric enclosure 47A (see FIG. 2) that may be made of glass and which is filled with a gas consisting of 98% nitrogen and 2% hydrogen, for example, for improving the isolation thereof. The contacts 41A and 42A are spaced apart and are coextensive over the major portion of the length thereof. The contact 43A is located between the other contacts with the free ends thereof overlapping. The contacts 41A and 43A are oriented in the enclosure 47A for physically contacting each other and making an electrical connection therethrough when the relay is de-energized, i.e., when an electrical control current is not passed through the winding 45A (see FIG. 2). The movable reed 43A moves into contact with the stationary reed 42A (see FIG. 1) only when an electrical control current is passed through the winding 45A. The other ends of the reeds 42A and 43A are directly electrically connected to the ends of lines 22 and 11, respectively. The other end of reed 41A is capacitively coupled to line 21.

In accordance with this invention, a strip of electrically conductive copper foil 49A is wrapped at least once around the dielectric enclosure 47A to form a tube or sleeve. The foil 49A is substantially parallel to the reeds 41A-43A over the length of the enclosure 47A, and has a thickness that is greater than the skin depth at a prescribed frequency, as is described more fully hereinafter. The relay assembly 40A is mounted in a rectangularly shaped enclosure 35 so that the reeds 41A-43A and sleeve 49A are substantially parallel to a broad wall 35 of the ground plane-enclosure 35. The insulated wire 53A forming the excitation coil 45A on the relay is wound around the foil 49A, over the length of the tubular glass enclosure 47A, and secured thereto with Mylar ® tape 55A.

The series combination of the control circuit 31 and relay windings 45B and 45A is electrically connected across the terminals of the power supply 33. The circuit 31 monitors the operation of amplification means 25 for detecting whether it is operating satisfactorily or is malfunctioning. This may be accomplished by monitoring the DC current in active elements of the amplification means, as is illustrated in the U.S. patent application Ser. No. 193,315 filed Oct. 1, 1980 entitled "Differential Current Detector in Cable Television Trunk Amplifier Station" by Sai W. Kwok (D-22,854) that is assigned to the assignee of this invention, and which is incorporated herein by reference. The control circuit 31 may internally produce positive and negative control voltages when the amplification means operates satisfactorily and malfunctions, respectively. The circuit 31 is also selectively operative for passing a DC control current from supply 33 through it and the relay coils. In one arrangement, the circuit 31 may comprise an NPN switching transistor (not shown) having collector and emitter electrodes electrically connected to lines 66 and 67. The base electrode of the transistor is responsive to a positive control voltage for causing the transistor to conduct and pass a control current through the relay coils when the amplification means operates satisfactorily, and is responsive to a negative control voltage for cutting off the transistor and de-energizing the relay coils when the amplifier means 25 malfunctions.

During normal operation in which the amplifier means 25 is functioning properly, an electrical current flows through both of the coils 45A and 45B. The induced electromagnetic field on the coils magnetizes the reeds so as to cause reeds 41A and 43A to repel each other and reeds 42A and 43A to attract each other for moving these reeds 42A and 43A together to make an electrical connection therethrough. This operation connects the amplifier means 25 and line 22 in series with the trunk lines 11 and 12 for amplifying first RF signals on the trunk cable. When the control circuit detects a malfunction of the amplifier means 25, such as a decrease of a specified amount in the DC current in the amplifier, it opens circuits the current path through the coils for de-energizing them. This causes the moveable reeds 43 to return to their normally closed position and to physically touch the associated lower reed 41. This enables first RF signals in line 11 to be bypassed around a defective amplifier means and continued to be passed on a trunk cable although the signal may be of a lower level than is desired.

Figure 3:
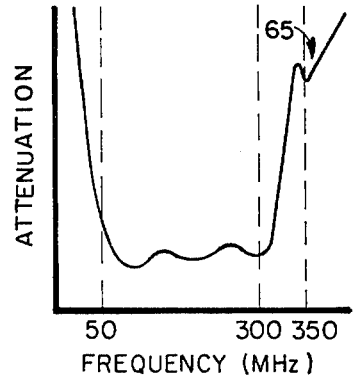
FIG. 3 is a curve illustrating the overall response of the trunk station equipment in FIG. 1 operating in the amplification mode.

The isolation in the station is essentially the decibel ratio of the input power on trunk line 11 to the output power on trunk line 12 when the relays are in the energized state and the amplification line 22 is terminated in its characteristic impedance. Considering the basic structure of the relays, it will be recognized that there is a very small coupling capacitance between at least the open contacts 41A and 43A when the station is operating in the amplification mode. In order to increase the isolation in the bypass line during operation in the amplification mode, PIN diodes 61 and 62 are electrically connected between ground and opposite ends of the center conductor of the coaxial line 21. Current on line 67 for energizing the coils 45 is also passed on line 68 for selective biasing the diodes into conduction. Although this greatly improves the performance of the station equipment, there is a pronounced perturbation 65 in the isolation and overall station response at an out-of-band frequency of approximately 350 MHz, as is illustrated in FIG. 3. It has been determined that this impairment in the response of an individual trunk station will become broader and deeper in the overall response of a system including cascaded station units. It is important, therefore, that the isolation and response of the trunk station be improved in the frequency band around 350 MHz.

The frequency at which this impairment in the station response occurs is believed to be related to the characteristics of the coaxial transmission line 21, diodes 61 and 62, and the coupling capacitances between open reeds 41 and 43 in the relays. The coaxial transmission line 21 is therefore selected to have a high velocity of propagation for shifting the frequency at which the perturbation 65 occurs as high as possible in frequency and away from the 50-300 MHz passband of the amplifier means.

In order to further increase the out-of-band loss at 350 MHz, RF traps are designed into the relay circuits at opposite ends of the lines 21 and 22. This is accomplished by mounting the relay assemblies 40 in the trunk station housing 35 with the axes of foil sleeves 49 and associated reeds 41-43 parallel to and offset from a broad surface of the enclosure 35 which operates as a ground plane. This causes the sleeves and associated reeds to operate in conjunction with the ground plane 35 as lengths of coupled transmission lines. Lengths 71A and 72A of electrically conductive wire are then connected between opposite edges of the foil 49A and one sides of variable capacitors 75A and 76A which have the other sides thereof directly electrically connected to ground. These lengths of wire operate as an inductances in series with associated capacitors at RF frequencies. The reactances of the capacitors 75A and 76A and wires 71A and 72A cooperate with the characteristics of the coupled transmission lines (comprising the sleeve 49A and associated reeds) so as to operate as a trap for passing signals having particular frequencies to ground and away from the lines. The capacitances of the capacitors 75A and 76A are varied for adjusting the particular frequencies of signals that are passed to ground by the relay circuit 27 to be centered around 350 MHz. It is believed that the trapping structure in this circuit 27 operates similar to a capacitor connected in series with a shunt LC circuit, the latter being tuned to be sharply inductive around 350 MHz for causing it and the series capacitor to simulate a series resonant circuit at these frequencies. The structure and operation of relay circuit 29 is similar.

In an embodiment of this invention that was built and operated satisfactorily, the relay structures 40A and 40B were made to applicant's specification by Hamlin, Inc., Lake Mills, Wisconsin. The reeds 41A-43A were mounted in a glass tube 47A and measured approximately 0.05 inch wide and 0.01 inch thick. The reed 43A was approximately 5/16 inch long in the enclosure 47A with the free end thereof reduced in width. The corresponding lengths of reeds 41A and 42A were ⅛ inch long. The glass tube 47A had an outer diameter of ⅛ inch and was filled with a mixture of 98% nitrogen and 2% hydrogen for increasing contact life and decreasing the coupling capacitance between the open contacts 41A and 43A which was determined to be approximately 0.7 picofarad. The copper foil 49A was 0.5 inch wide and 0.75 inch long and had a thickness of 0.1003 inch, which is greater than the skin depth at 350 MHz. Each of the lengths 71A and 72A of wire was a 0.375 inch length of #34 AWG wire. The capacitors had capacitances that were variable from 2-10 picofarad and had one sides thereof directly electrically connected to a ground line on a printed circuit board. The line 21 was a 10 inch length of RG 59 coaxial cable having a dielectric constant of 1.4. The line 22 was UT-85-75 rigid coaxial cable of Uniform Tubes, Inc. of Collegeville, Pa. The diodes on opposite ends of the coaxial cable 21 were Motorola MPN 3401 PIN diodes, which conduct only when the relay coils are energized. Each of the frequency selective-trapping relay circuits 27 and 29 provided approximately 20 dB of additional isolation at around 350 MHz. This is a total of 40 dB isolation for the two relay circuits in the station 5, which substantially eliminates the perturbation 65 in the overall response of the station at 350 MHz.

Although this invention is described in relation to preferred embodiments thereof, variations and modifications will occur to those skilled in the art. By way of example, each of the relay circuits may comprise first and second glass tubes, one containing a pair of normally open reeds and the other containing a pair of normally closed reeds for increasing the reed spacing and isolation in the circuits. The moveable reed in each enclosure is connected to the trunk line. Individual sleeves may then be wrapped around associated glass tubes, with opposite edges of each foil being connected to the one sides of associated capacitors. Alternatively, opposite ends of first and second wires may be connected to one side of an associated capacitor and to one edge of an associated foil sleeve, with a third wire connecting the opposite edges of the two foil sleeves together so that the two sleeves are electrically connected in series. In another embodiment, a single foil sleeve may be wrapped around the two glass tubes. Further, each relay may include a permanent magnet for keeping the contacts 41 and 43 thereof firmly in a normally closed position. Also, a single wire may be employed to connect the one sides of the capacitors 75A and 76B to the foil sleeve 49A. The single wire can be a spot welded only to the center of the foil, to any other single point on the foil, to opposite edges of the foil, or to a plurality of points along the length of the foil. The scope of this invention is therefore to be determined from the appended claims rather than from the aforementioned detailed descriptions of preferred embodiments thereof.

What is claimed is:

1. Apparatus responsive to the absence and presence of a control signal for selectively passing first RF signals with first frequencies in a first prescribed frequency band on a main transmission line to first and second lines, respectively, and for passing second RF signals with second frequencies that are in a second prescribed frequency band that is greater than frequencies in the first frequency band, away from the lines, comprising:

first switch means having a first, second and third elongated terminal contacts with one ends electrically connected to the first, second and main lines, respectively; the other ends of the first and third contacts making an electrical connection therebetween in the absence of a control signal for passing the first signal along the main and first lines;

first means responsive to the presence of the control signal for causing the second and third contacts to make an electrical connection therebetween for passing the first signals along the main and second lines;

a tubular conductive member electrically spaced from, extending over at least a major portion of the lengths of, and extending around the contacts of said first switch means so as to provide capacitive coupling between it and the said contacts;

a first capacitor having one side thereof connected to a ground reference potential; and a first length of electrically conductive wire electrically connecting the other side of said first capacitor to said tubular member;

the reactances and/or coupling provided by said capacitor, said tubular member, said contacts, and said wire being selected to cooperate so the apparatus operates as a trap for passing the second signals on said lines to ground.

2. Apparatus according to claim 1 which is operative in conjunction with a ground plane that is connected to the ground reference potential and spaced from said switch means, tubular conductive member, and wire, and wherein said contacts are elongated electrically conductive members that are substantially parallel to each other over at least a portion of the lengths thereof that are adjacent, their other ends being overlapping with said third contact being located between said first and second contacts.

3. Apparatus according to claim 2 wherein said tubular member is a thin layer of conductive material extending around a dielectric member that insulates it from said contacts, said layer of conductive material having a thickness that is greater than the skin depth at the frequencies of second signals.

4. Apparatus according to claim 3 comprising a second capacitor having one side connected to ground and a second length of electrically conductive wire electrically connecting the other side of said second capacitor to said tubular member, the capacitances of said first and second capacitors being variable for causing the reactances and/or coupling provided by them, said lengths of wires, said tubular member, and said contacts to cooperate so that the apparatus operates as a trap at the second frequencies for passing the second signals on said lines to ground.

5. Apparatus according to claim 4 wherein ends of said first and second lengths of wires are electrically connected to said tubular member adjacent opposite edges thereof.

6. Apparatus according to claim 3 wherein said contacts and tubular member may operate, in conjunction with the ground plane, as lengths of coupled transmission lines having characteristics cooperating with the reactances thereof and of said capacitor and said length of wire for operating as a trap at the second frequencies for passing second signals on said lines to ground.

7. Apparatus according to claim 3 wherein the characteristics of said length of wire and/or tubular member are selected for providing an inductance in series with said capacitor and with capacitive coupling between said tubular member and said contacts so as to effectively create a resonant circuit between ground and said contacts at the second frequencies for effectively passing the second signals to ground.

8. Apparatus according to claim 6 or 7 wherein said first line is a length of coaxial transmission line having diode means at opposite ends thereof that are responsive to the presence of the control signal for electrically connecting said coaxial line to ground for effectively short circuiting the ends thereof, said first line and diodes having characteristics which cooperate with coupling capacitance between said contacts for establishing a frequency selective condition at frequencies greater than the first frequencies that may enable second frequencies to be coupled between the main and first lines when second and third contacts operate to make an electrical connection between the latter.

9. Apparatus according to claim 8 wherein said tubular member is a thin sheet of conductive foil wrapped at least once around said dielectric member.

10. Apparatus according to claim 8 wherein said switch means comprises a reed relay comprising a third reed contact that is located between and parallel to first and second spaced-apart electrically conductive reed contacts thereof that are coextensive, said third reed having only a portion of the other end thereof located between said first and second reeds.

11. Trunk station apparatus electrically connected in series between first and second lengths of a trunk transmission line carrying first RF signals with first frequencies in a first frequency band in a cable television system, comprising:

amplification means,
ground plane means,
a length of first transmission line of prescribed length spaced from and located over said ground plane means and having opposite ends thereof, p1 a length of second line spaced from and located over said ground plane means, having said amplification means connected in series therein, and having opposite ends thereof,
first and second relay switching means at one and other, respectively, of the opposite ends of said first and second lines, each switch means having first, second and third terminal contacts spaced from and located over said ground plane means and having one ends electrically connected to associated ends of said first, second and trunk lines, respectively,
first and second diode means electrically connected between opposite ends of said first line and ground,
control means responsive to malfunction of said amplification means for enabling cutoff of said diode means, and for causing said first and third contacts of both of said switch means to make electrical connection therebetween for passing first signals along the lengths of trunk line and said first line without amplification, and responsive to satisfactory operation of said amplification means for causing said diode means to conduct for effectively short circuiting opposite ends of said first line to ground and for causing said second and third contacts of both of said switch means to make an electrical connection therebetween for passing the first signals along the lengths of trunk line with amplification,
said first line, diode means, and relay contacts being capable of passing second RF signals having second frequencies that are greater than those of first signals when the said first and third contacts of said switch means are spaced apart,
each of said relay means further comprising:
an electrically conductive tubular member electrically spaced from, extending over at least a portion of the lengths of, and extending around said contacts so as to provide capacitive coupling between it and at least said contacts,
a capacitor having one side connected to ground; and
a first length of wire electrically connecting the other side of said capacitor to said tubular member,
the reactances and/or coupling provided by said capacitor, said tubular member, said contacts, and said length of wire cooperating so as to operate as a trap for passing signals of second frequencies on said lines to ground.

12. Trunk station apparatus according to claim 11 wherein said contacts are elongated electrically conductive members that are substantially parallel to each other over at least a portion of lengths thereof that are adjacent, their other ends being overlapping with said third contact being located between said first and second contacts.

13. Trunk station apparatus according to claim 12 wherein said contacts and tubular member of each of said switch means may operate, in conjunction with said ground plane means, as lengths of coupled transmission lines having characteristics cooperating with the reactances thereof and of said capacitor and length of wire for operating as a trap at the second frequencies for passing second RF signals on said lines to ground.

14. Trunk station apparatus according to claim 12 wherein the characteristics of said lengths of wires and/or tubular members are selected to provide an inductance in series with an associated capacitor and with capacitive coupling between an associated tubular member and contacts so as to effectively create a resonant circuit between ground and said contacts at the second frequencies for effectively passing second signals to ground.

15. Trunk station apparatus according to claim 13 or 14 wherein said first line is a length of coaxial transmission line, said first line and first and second diode means having characteristics which cooperate with coupling capacitance between contacts of said first and second switch means for establishing a frequency selective condition at frequencies greater than the first frequencies that may enable signals of second frequencies to be coupled between the main and first lines when only second and third contacts of said switch means make electrical connection therebetween.

16. Trunk station apparatus according to claim 15 wherein said tubular member is a thin sheet of conductive foil wrapped at least once around a dielectric member that insulates it from said contacts, said layer of conductive material having a thickness that is greater than the skin depth at the second frequencies.

17. Trunk station apparatus according to claim 16 wherein each of said relay means further comprises a second capacitor having one side connected to ground and a second length of wire electrically connecting the other side of said second capacitor to said foil, the capacitances of said capacitors being variable for causing the reactances and/or coupling provided by them, said lengths of wires, said tubular member, and said contacts to operate as a trap at the second frequencies for passing second signals of such frequencies on said lines to ground.

18. Trunk station apparatus according to claim 17 wherein each of said switch means comprises reed relay with form C type reed contacts in which said third contact is an electrically conductive reed that is between and parallel to first and second elongated spaced-apart electrically conductive reeds thereof that are coextensive over at least the major portion of the lengths thereof, said third reed having only a portion of the other end thereof located between said first and second reeds, said first and third being directly electrically connected together when said control means senses malfunction of said amplification means.

* * * * *